Figure 1:
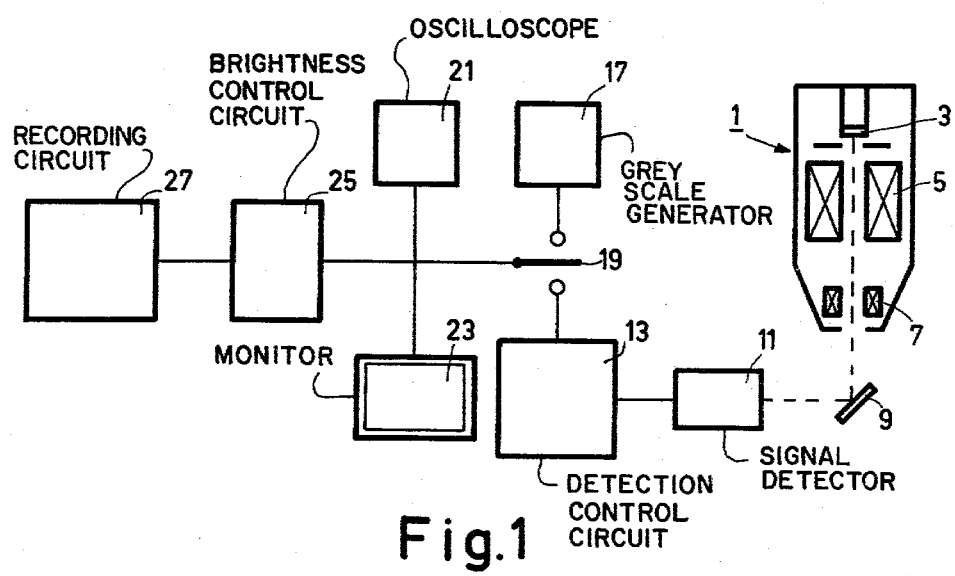

United States Patent [19]

Tiemeijer

[11] 4,236,178
[45] Nov. 25, 1980

[54] ELECTRON MICROSCOPE WITH BRIGHTNESS/CONTRAST INDICATOR

[75] Inventor: Johan C. Tiemeijer, Eindhoven, Netherlands

[73] Assignee: U.S. Philips Corporation, New York, N.Y.

[21] Appl. No.: 2,419

[22] Filed: Jan. 10, 1979

[30] Foreign Application Priority Data

Jan. 25, 1978 [NL] Netherlands ............................ 7800869

[51] Int. Cl.³ ................................................ H04N 5/14
[52] U.S. Cl. ........................................ 358/93; 358/168;
358/169; 250/311; 340/782
[58] Field of Search ................. 313/498, 499; 340/660,
340/662, 782; 250/311; 358/93, 160, 168, 169

[56] References Cited

U.S. PATENT DOCUMENTS

| | | | |
|---|---|---|---|
| 3,886,305 | 5/1975 | Yew et al. ............................ | 358/169 |
| 3,898,642 | 8/1975 | Dorey et al. ..................... | 340/782 X |
| 3,987,392 | 10/1976 | Kugelmann et al. .................. | 324/96 |

FOREIGN PATENT DOCUMENTS

1352609  5/1974  United Kingdom .

Primary Examiner—Robert L. Richardson
Attorney, Agent, or Firm—Thomas A. Briody; Robert T. Mayer; Paul R. Miller

[57] ABSTRACT

A series of LED elements is included in a scanning electron microscope in order to indicate the brightness and the contrast of a video signal to be recorded. The brightness is indicated by the position of an illuminating LED element, and the contrast is indicated by the number of alternately illuminating LED elements. The use of different colors for the LED elements provides an indication as to how far the signal to be detected may be intensified. The number of the centrally arranged LED elements of the same color preferably corresponds to the number of grey levels of a grey scale generator included in the circuit.

4 Claims, 2 Drawing Figures

ELECTRON MICROSCOPE WITH BRIGHTNESS/CONTRAST INDICATOR

The invention relates to an electron microscope comprising a scanning device which is coupled to a television chain, a visual display for displaying a video signal generated from an object to be scanned, and an adjusting means for adjusting the contrast and the brightness of a video signal to be displayed.

In an electron microscope of this kind, optimum adjustment of the video signal, the amplitude and hence the contrast and the signal level, and hence the brightness, is desired before these signals are applied to the visual display. In practical embodiments therefore, an electron microscope of this kind comprises two meters as the adjusting means, a first meter indicating the mean signal amplitude while the second meter indicates the signal level. This method has a drawback, in that only mean values are indicated, while fast variations in the signal are not followed. According to another method, use is made of an oscilloscope for displaying the video signal. All fast signal variations are then taken into account for adjusting the contrast and the brightness. This method, however, is comparatively expensive.

The present invention has for its object features to mitigate these drawbacks, and to this end an electron microscope of the described kind includes that the adjusting means comprises a series of LED elements which are combined in a circuit in which, when the video signal to be recorded reaches a given level, an LED element of the series adjusted for this particular level is activated.

In an electron microscope in accordance with the present invention, therefore, the brightness of the television signal to be recorded is indicated by the position of a light-emitting LED element in this series and the contrast is indicated by the number of alternately illuminating LED elements.

In a preferred embodiment in accordance with the present invention, the LED elements at the ends of the series are of a different color, thus providing a direct indication for a video signal which is too large in view of the range of a signal amplifier to be used and the contrast range of the visual display.

In a further preferred embodiment, the number of central LED elements of the same color equals the number of grey levels of a grey scale generator to be used in the arrangement.

Some preferred embodiments in accordance with the invention will be described in detail hereinafter with reference to the accompanying diagrammatic drawing.

Figure 2:
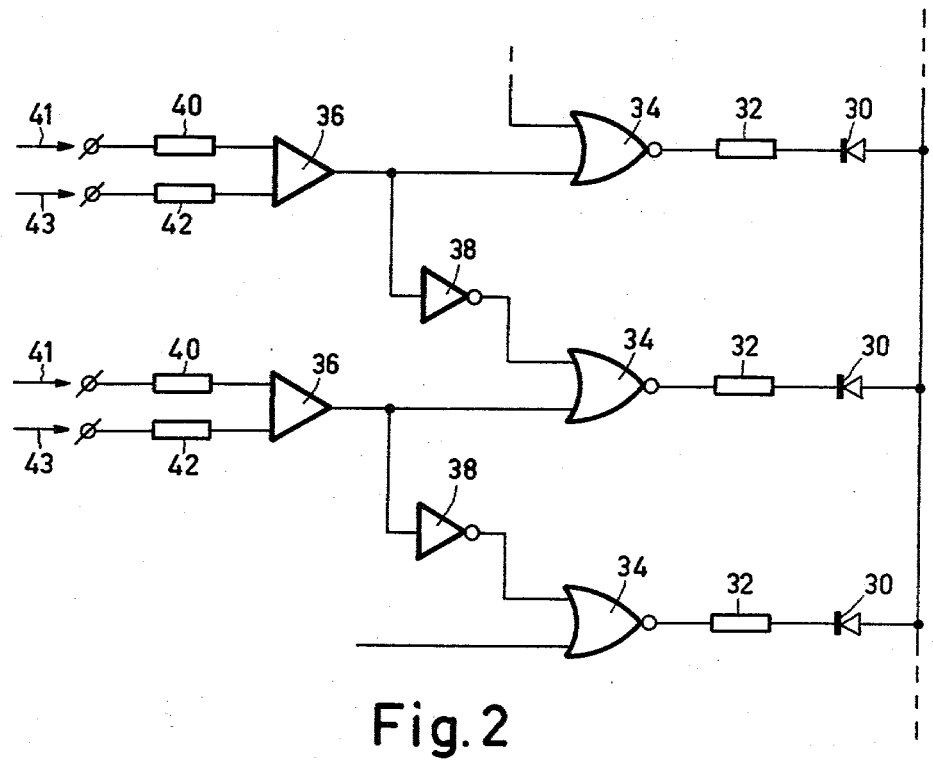

FIG. 1 is a block diagram of a video system of a scanning electron microscope in accordance with the present invention, and FIG. 2 is a circuit diagram of a preferred embodiment of an indicator in accordance with the present invention.

A device as shown in FIG. 1 comprises an electron microscope 1, including an electron source 3, a lens system 5, a deflection system 7, an object 9, and a signal detector 11. For recording a signal derived from the detector, for example, given by secondary radiation of the object, the device comprises a detector control unit 13 and a grey scale generator 17. Each of these units can be connected, by way of a selector switch 19, to an oscilloscope 21 which includes a monitor 23, and to a recording through an automatic brightness control unit 25. The recording device 27 is constructed, for example, as a magnetic tape recorder or a camera.

In accordance with the invention, the monitor 23 preferably includes a circuit as diagrammatically shown in FIG. 2. A visibly arranged series of LED elements 30 comprises a central section, comprising, for example, 10 elements which emit, for example, green light, and on either side thereof, for example, two elements which emit yellow light, and on the outer side thereof one element each which emits red light. The 10 elements emitting green light preferably correspond to 10 grey values of the grey scale generator 17 of the television chain.

Each of the LED elements 30 has coupled to it a resistor 32 and an OR-gate 34. Each of the OR-gates 34 is connected to a comparison circuit 36 through inverters 38, to a preceding comparison circuit 36 as well as to a next OR-gate 34.

A video signal 41 to be recorded is applied to each of the comparison circuits 36 through a resistor 40, while a reference signal 43 is applied thereto through a resistor 42. The video signal to be recorded, applied through a detection line, is thus compared in the comparison circuits with a reference signal to be supplied, for example, by a signal generator (not shown), the reference signal being one step higher for each of the successive comparison stages. The logic circuit ensures that only a single one of the LED elements can be activated at any instant.

What is claimed is:

1. An electron microscope comprising a beam scanning device coupled to a television chain, visual display means for displaying a video signal generated from an object, adjusting means for adjusting contrast and brightness of a video signal to be displayed, said adjusting means comprising a series of LED elements combined in a circuit in which, when the video signal to be recorded reaches a given level, an LED element of the series which is adjusted for this particular level is activated.

2. An electron microscope as claimed in claim 1, wherein said LED elements are line-wise arranged and emit different colors in a sequence which is symmetrical with respect to a central section.

3. An electron microscope as claimed in claim 1, wherein a number of grey levels of a grey scale generator included in the system corresponds to the number of centrally arranged LED elements of the same color.

4. An electron microscope as claimed in claim 1, wherein said LED elements at the ends of said series are of a different color.

* * * * *